(12) United States Patent
Kodaira (10) Patent No.: US 10,070,527 B2
(45) Date of Patent: Sep. 4, 2018

(54) SEMICONDUCTOR DEVICE

(71) Applicant: FUJI ELECTRIC CO., LTD., Kawasaki-shi, Kanagawa (JP)

(72) Inventor: Yoshihiro Kodaira, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 52 days.

(21) Appl. No.: 15/200,541

(22) Filed: Jul. 1, 2016

(65) Prior Publication Data

US 2017/0042051 A1 Feb. 9, 2017

(30) Foreign Application Priority Data

Aug. 4, 2015 (JP) .................. 2015-154341

(51) Int. Cl.
*H05K 1/18* (2006.01)
*H01L 23/057* (2006.01)
*H01L 23/373* (2006.01)
*H01L 23/00* (2006.01)
*H01L 25/07* (2006.01)

(52) U.S. Cl.
CPC ............ *H05K 1/18* (2013.01); *H01L 23/057* (2013.01); *H01L 23/3735* (2013.01); *H01L 24/29* (2013.01); *H01L 24/32* (2013.01); *H01L 24/48* (2013.01); *H01L 24/73* (2013.01); *H01L 24/83* (2013.01); *H01L 25/072* (2013.01); *H01L 2224/291* (2013.01); *H01L 2224/32225* (2013.01); *H01L 2224/48227* (2013.01); *H01L 2224/73265* (2013.01); *H01L 2224/8384* (2013.01); *H01L 2924/00014* (2013.01)

(58) Field of Classification Search
CPC .................... H01L 23/057; H01L 23/3735
See application file for complete search history.

(56) References Cited

U.S. PATENT DOCUMENTS 6,597,585 B2 7/2003 Ferber et al.
7,994,635 B2 * 8/2011 Soda .................. H01L 23/3735
257/691
8,526,199 B2 * 9/2013 Matsumoto ............ H01L 23/04
361/783

(Continued)

FOREIGN PATENT DOCUMENTS

JP H05-15445 U 2/1993
WO WO-2012/124209 A1 9/2012

*Primary Examiner* — Hoa C Nguyen
*Assistant Examiner* — Keith Depew
(74) *Attorney, Agent, or Firm* — Rabin & Berdo, P.C.

(57) ABSTRACT

When a nut housing member is inserted from a first opening portion into a case (terminal housing area) in a semiconductor device, first and second protrusions of the nut housing member slide on and pass through the first and second opening portions. Ultimately, the nut housing member is housed in the case (terminal housing area), with the first protrusion being in contact with a lower end of the second opening portion and the second protrusion being in contact with a lower end of the first opening portion. Even if the nut housing member is not inserted in parallel with the terminal housing area, the forefront does not hit against a first beam. Therefore, the nut housing member is inserted stably and housed reliably in the terminal housing area of the case, and the assemblability of the nut housing member with respect to the case is improved.

14 Claims, 9 Drawing Sheets

(56) References Cited

U.S. PATENT DOCUMENTS

| | | | |
|---|---|---|---|
| 8,975,740 B2* | 3/2015 | Horie | H01L 23/049 |
| | | | 257/693 |
| 9,078,355 B2* | 7/2015 | Kodaira | H01L 25/072 |
| 9,673,129 B2* | 6/2017 | Hori | H01L 25/07 |
| 2013/0250535 A1* | 9/2013 | Takamiya | H01L 23/043 |
| | | | 361/783 |
| 2013/0334676 A1* | 12/2013 | Kodaira | H01L 23/142 |
| | | | 257/690 |

* cited by examiner

SEMICONDUCTOR DEVICE

CROSS-REFERENCE TO RELATED APPLICATION

This application is based upon and claims the benefit of priority of the prior Japanese Patent Application No. 2015-154341, filed on Aug. 4, 2015, the entire contents of which are incorporated herein by reference.

BACKGROUND OF THE INVENTION

1. Field of the Invention

The embodiments discussed herein are related to a semiconductor device.

2. Background of the Related Art

Power semiconductor modules (semiconductor devices) are widely used as inverter devices such as power converter.

Such semiconductor devices have the following structure. For example, a semiconductor chip is disposed over a front surface of an insulating board having a conductive pattern with solder therebetween. A control terminal electrically connected to a control electrode of the semiconductor chip is disposed over the front surface with its one leg portion therebetween. A case (resin case) is attached to the insulating board having the conductive pattern and the semiconductor chip. An opening portion is formed in an upper surface of the case and the control terminal is exposed from the opening portion. A beam of the control terminal is fixed at the one leg portion. As a result, the stiffness of the beam is reduced and a positional deviation of the surface of the control terminal from the case tends to occur. Accordingly, with the above semiconductor devices a nut housing member (resin body) in which a nut is disposed is disposed under an under surface of the control terminal which is exposed from the opening portion of the case.

Please see, for example, International Publication Pamphlet No. WO2012/124209

By inserting the nut housing member into the case through an opening portion in a side surface of the case, the nut housing member is disposed under the under surface of the control terminal. At this time, however, the nut housing member may not be inserted smoothly into the case. That is to say, the mountability (assemblability) of the nut housing member in the case is not good.

SUMMARY OF THE INVENTION

According to an aspect, there is provided a semiconductor device including a laminated substrate having an insulating board and a circuit board disposed over a principal plane of the insulating board; a semiconductor chip disposed over the circuit board; a control terminal having a fixed portion with a first surface and a second surface opposite the first surface, disposed over the circuit board, and electrically connected to a control electrode of the semiconductor chip; a case which has a first beam formed on an upper surface, on a side surface that connects with the upper surface, and in an inside, which has a first opening portion formed in the side surface and a second opening portion formed opposite the first opening portion in the first beam, and which has a terminal housing area between the first opening portion and the second opening portion for housing the control terminal, the case being disposed on a principal plane side of the insulating board, the case covering the circuit board and the semiconductor chip, the first surface of the fixed portion being exposed from the terminal housing area on the upper surface side; and a nut housing member which has a third surface and a fourth surface opposite the third surface, and which has a first protrusion disposed on a front side of the fourth surface, a second protrusion disposed on a back side of the fourth surface, and a concavity disposed between the first protrusion and the second protrusion, the nut housing member housing a nut, wherein the nut housing member is inserted from the first opening portion, through the second surface side of the fixed portion, into the second opening portion, the first protrusion is in contact with a lower end of the second opening portion, and the second protrusion is in contact with a lower end of the first opening portion.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Embodiments will now be described with reference to the accompanying drawings, wherein like reference numerals refer to like elements throughout.

First Embodiment

A semiconductor device according to a first embodiment will be described first by the use of FIGS. 1A and 1B.

Figure 1A:
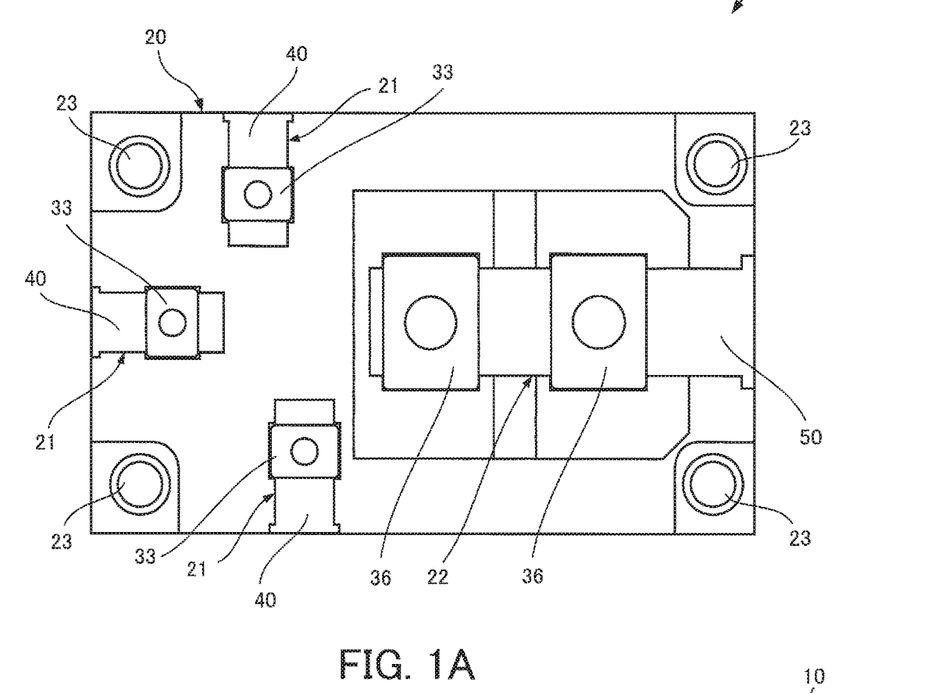
FIGS. 1A and 1B illustrate a semiconductor device according to a first embodiment.
Figure 1B:
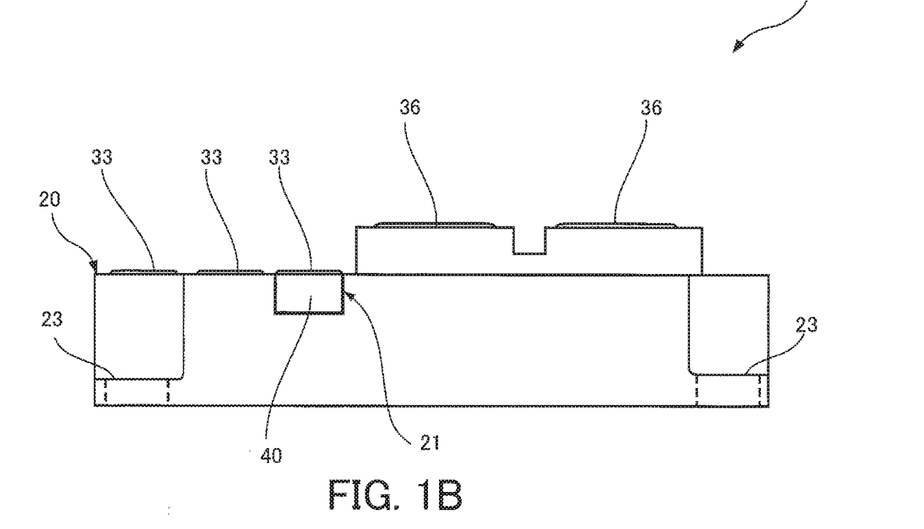

FIGS. 1A and 1B illustrate a semiconductor device according to a first embodiment.

FIG. 1A is an external top view of a semiconductor device 10. FIG. 1B is an external side view of the semiconductor device 10.

The semiconductor device 10 includes a laminated substrate 32, semiconductor chips 39, control terminals 33, a case 20 which covers the laminated substrate 32, and nut housing members 40.

Threaded holes 23 for screwing the semiconductor device 10, together with a heat radiation metal board 31 disposed on an under surface side, to a cooler or the like are made in the case 20. Furthermore, terminal housing areas 21 are formed in side surfaces of the case 20. A control terminal 33 and a nut housing member 40 are disposed in each terminal housing area 21. Similarly, a terminal housing area 22 is formed in the case 20. Main terminals 36 and a nut housing member 50 are disposed in the terminal housing area 22. The heat radiation metal board 31 is made of a metal material such as copper or aluminum. The case 20 may be adhered to the heat radiation metal board 31. The inside of the case 20 is sealed with gel so as to cover the laminated substrate 32 and the semiconductor chip 39.

Next, the case 20 will be described by the use of FIGS. 2A and 2B and FIGS. 3A and 3B.

FIGS. 2A and 2B and FIGS. 3A and 3B illustrate the case included in the semiconductor device according to the first embodiment.

Figure 2A:
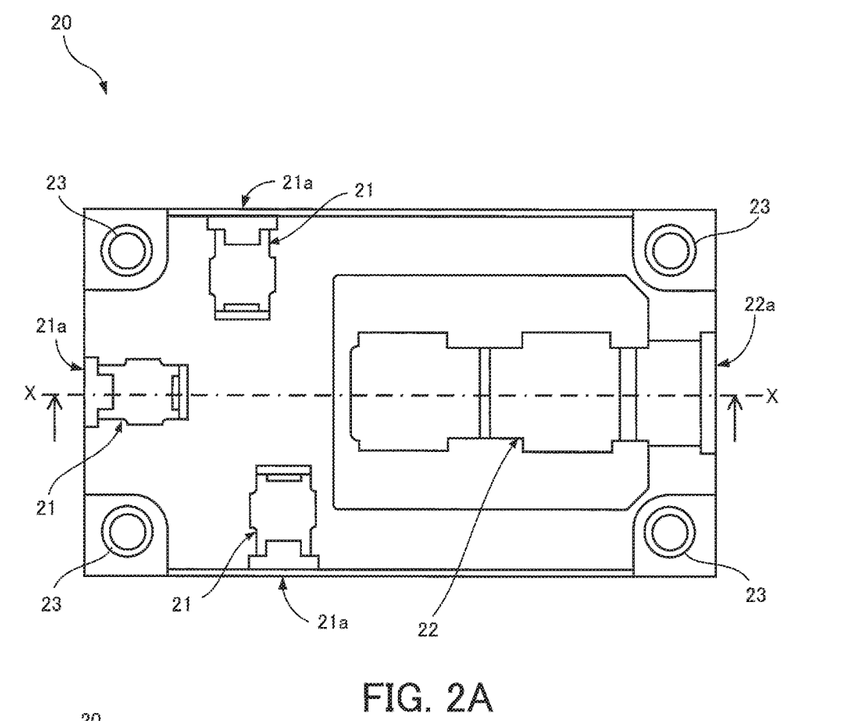
FIGS. 2A and 2B illustrate a case included in the semiconductor device according to the first embodiment (part 1)
Figure 2B:
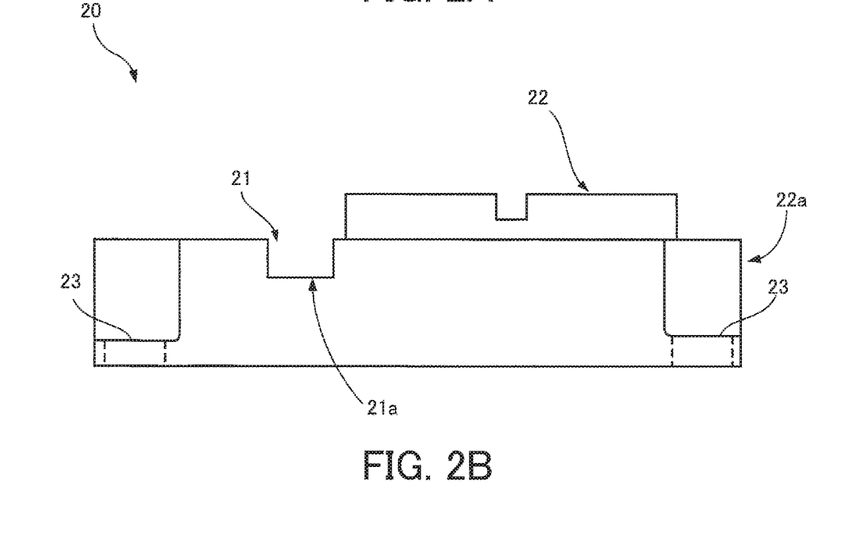
Figure 3A:
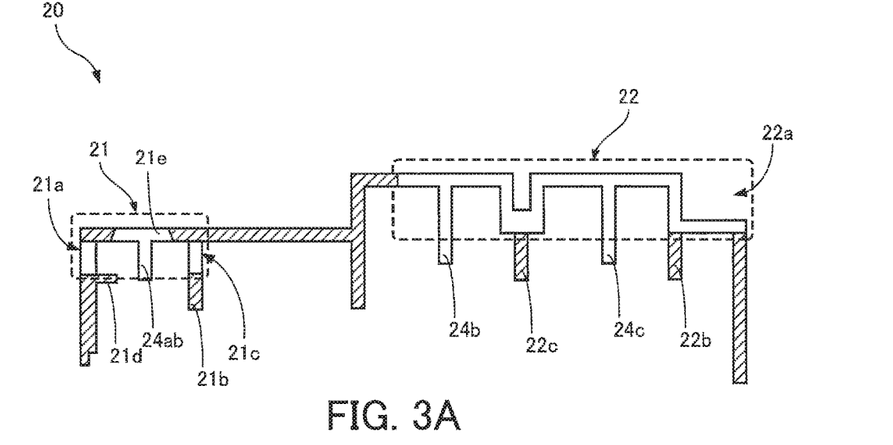
FIGS. 3A and 3B illustrate the case included in the semiconductor device according to the first embodiment (part 2)
Figure 3B:
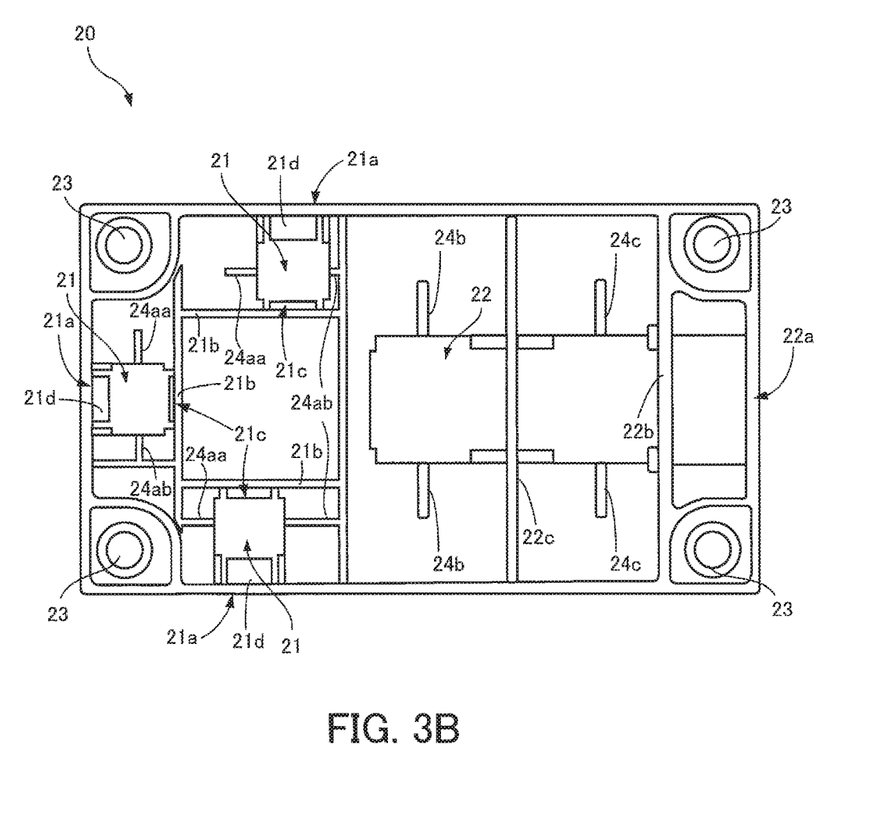

FIG. 2A is an external top view of the case 20. FIG. 2B is an external side view of the case 20. FIG. 3A is a sectional view taken along the dot-dash line X-X of FIG. 2A. FIG. 3B is a bottom view of the case 20.

The threaded holes 23 which are aligned with holes 23a made in the heat radiation metal board 31 disposed on the under surface side are made in four corners of the case 20.

As illustrated in FIGS. 2A and 2B, the case 20 is a box-shaped container having an upper surface and side surfaces which connect with the upper surface. First opening portions 21a are formed in side surfaces of the case 20. Furthermore, as illustrated in FIGS. 3A and 3B, a first beam 21b having second opening portions 21c opposite the first opening portions 21a is formed inside the case 20.

Each terminal housing area 21 includes a first opening portion 21a and a second opening portion 21c and is formed between the first opening portion 21a and the second opening portion 21c. As described in FIGS. 1A and 1B, a control terminal 33 is disposed in a terminal housing area 21. An opening portion 21e where a front surface of the control terminal 33 is exposed is formed on the upper surface side of the case 20. A first opening portion 21a may be a notch without an upper end and connect with an opening portion 21e. The details of the control terminals 33 will be described later. In addition, a pair of a second beam 24aa and a third beam 24ab is disposed in the case 20 so that it will face a terminal housing area 21 and so that the second beam 24aa and the third beam 24ab will be opposite each other with the terminal housing area 21 therebetween. Only one of the second beam 24aa and the third beam 24ab may be disposed in the case 20. Furthermore, as illustrated in FIG. 3B, the second beam 24aa and the third beam 24ab may be formed in a direction perpendicular to the paper surface of FIG. 3B in parallel with a first beam 21b and a first opening portion 21a.

In addition, as illustrated in FIGS. 2A and 2B, an opening portion 22a is formed in a side surface of the case 20. As illustrated in FIGS. 3A and 3B, the terminal housing area 22 leading from the opening portion 22a to the inside of the case 20 is formed. Beams 22c and 22b are formed in parallel with the opening portion 22a on the lower side of the terminal housing area 22 in FIG. 3A. Furthermore, as illustrated in FIG. 3B, a pair of beams 24b and 24c are formed with the terminal housing area 22 therebetween in parallel with the beams 22c and 22b in the lateral direction of the case 20 and in a direction perpendicular to the paper surface of FIG. 3B. The nut housing member 50 is inserted from the opening portion 22a into the terminal housing area 22 of the case 20 formed in this way.

The internal structure of the semiconductor device 10 covered with the above case 20 will now be described by the use of FIGS. 4A and 4B and FIGS. 5A through 5C.

Figure 4A:
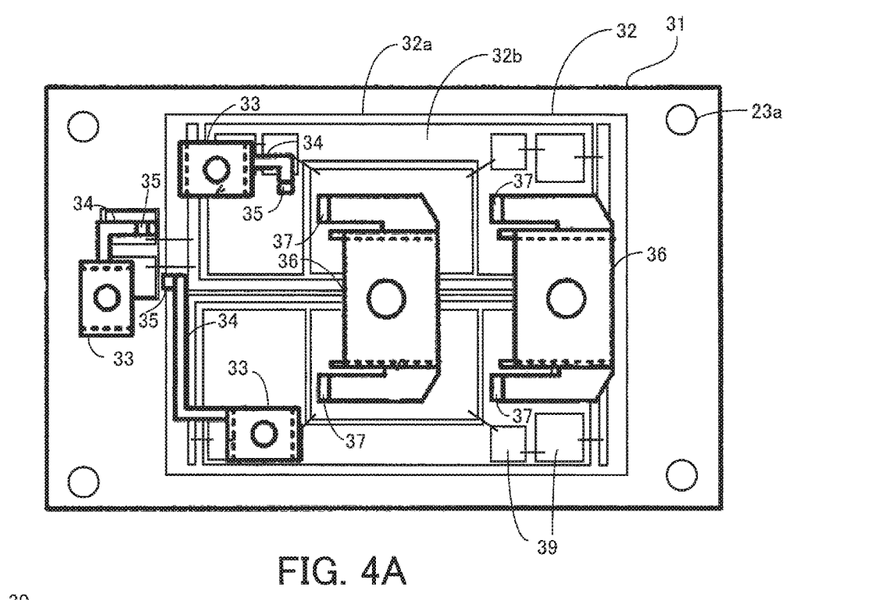
FIGS. 4A and 4B illustrate a laminated substrate included in the semiconductor device according to the first embodiment.
Figure 4B:
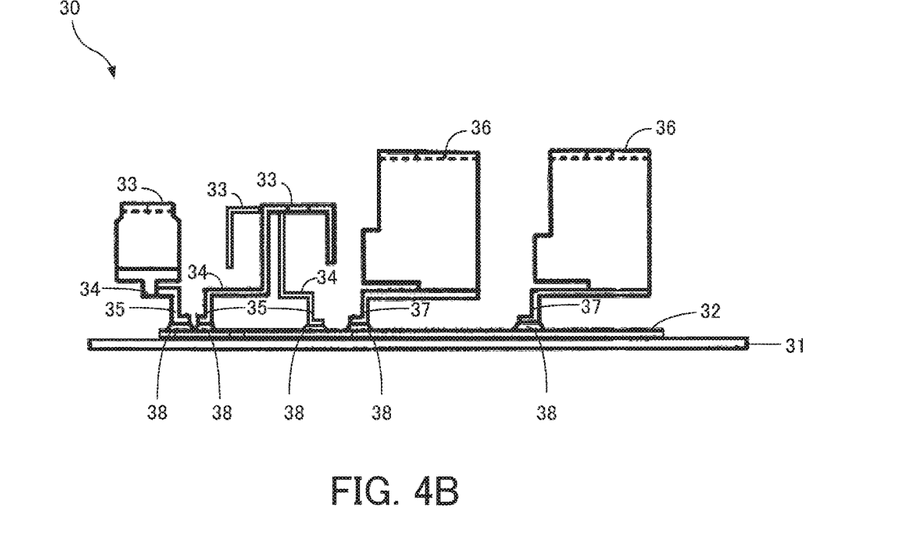
Figures 5A, 5B, 5C:
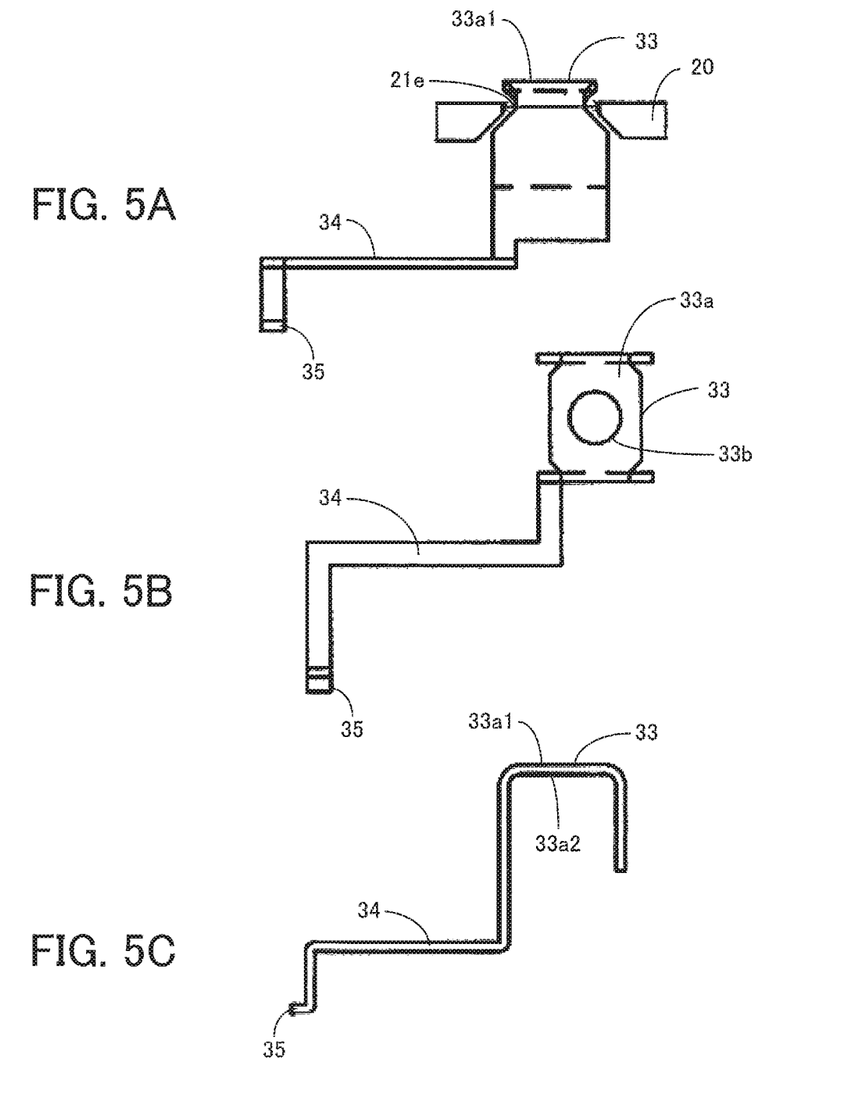
FIGS. 5A through 5C illustrate a control terminal included in the semiconductor device according to the first embodiment.

FIGS. 4A and 4B illustrate the laminated substrate and the like included in the semiconductor device according to the first embodiment. FIGS. 5A through 5C illustrate a control terminal included in the semiconductor device according to the first embodiment.

FIG. 4A is a top view of the internal structure of the semiconductor device 10. FIG. 4B is a side view of the internal structure of the semiconductor device 10. Furthermore, FIG. 5A is a side view of a control terminal 33 which is exposed from an opening portion 21e of the case 20. FIG. 5B is a top view of the control terminal 33. FIG. 5C is another side view of the control terminal 33.

The laminated substrate 32 includes an insulating board 32a and a circuit board 32b disposed over a principal plane of the insulating board 32a. The laminated substrate may further include a metal board disposed on the insulating board 32a opposite the circuit board 32b. The semiconductor device 10 includes the heat radiation metal board 31 (heat radiation base). Solder or the like (not illustrated) adheres the laminated substrate 32 to the heat radiation metal board 31. In addition, solder 38 adheres the main terminals (main circuit terminals) 36, the control terminals 33, and the semiconductor chips 39 to the circuit board 32b. Brazing filler metal or a sintered material may be used in place of solder. Furthermore, over the laminated substrate 32, the semiconductor chips 39 are electrically connected by bonding wires (not illustrated) and the semiconductor chips 39 and the circuit board 32b are electrically connected by bonding wires (not illustrated). By doing so, a circuit is formed. The control terminals 33 are electrically connected to control electrodes of the semiconductor chips 39.

When the case 20 is disposed on a principal plane side of the laminated substrate 32 and covers the internal structure including the circuit board 32b and the semiconductor chips 39, the main terminals 36 are housed in the terminal housing area 22 of the case 20 and the front surfaces of the main terminals 36 are exposed from the terminal housing area 22. Furthermore, the nut housing member 50 passes under the main terminals 36 housed in the terminal housing area 22 and is inserted into the terminal housing area 22.

Moreover, the control terminals 33 are housed in the terminal housing areas 21 and the front surfaces of the control terminals 33 are exposed from the opening portions 21e of the case 20 on the upper surface side of the case 20. Furthermore, the nut housing members 40 pass under the control terminals 33 housed in the terminal housing areas 21 and are inserted into the terminal housing areas 21 (see FIGS. 1A and 1B).

Because a main terminal 36 is thick and wide, it has high stiffness. In addition, because both leg portions 37 of a dual beam structure are fixed with the solder 38, it hardly deforms. An external wiring (not illustrated) is connected to a main terminal 36. A main terminal 36 and an external wiring connected thereto are fixed to each other by fitting a bolt (not illustrated) into a nut embedded in the nut housing member 50. That is to say, the nut housing member 50 disposed under a main terminal 36 has the function of fixing the main terminal 36 and therefore has the function of connecting an external wiring and the main terminal 36.

As illustrated in FIGS. 4A and 4B and FIGS. 5A through 5C, a control terminal 33 has a single beam structure and includes a beam 34. The control terminal 33 has a one leg portion 35 on one end side of the beam 34 and the one leg portion 35 is fixed onto the circuit board 32b with the solder 38. Furthermore, the control terminal 33 has a fixed portion 33a on a side of the beam 34 opposite the one leg portion 35. There are bends before and behind the fixed portion 33a and the control terminal 33 viewed from a side has the shape of an angular letter "J" (FIG. 5C). The fixed portion 33a housed in the case 20 has a first surface 33a1 on the upper surface side of the case 20 and a second surface 33a2 inside the case 20 opposite the first surface 33a1. There is a hole 33b in the fixed portion 33a. The control terminal 33 is made of metal such as copper, a copper alloy, or an aluminum alloy. A plating film may be formed on the surface of the control terminal 33.

The one leg portion 35 of the control terminal 33 is fixed with the solder 38. Therefore, if the beam 34 is narrow and long, then the beam 34 has low stiffness and tends to deform. As a result, the fixed portion 33a tends to positionally deviate upward or downward or right or left from the case 20. As illustrated in FIGS. 1A and 1B, with the semiconductor device 10 according to the first embodiment the nut housing members 40 pass under the control terminals 33 and are inserted into the terminal housing areas 21. By doing so, the control terminals 33 are fixed reliably. By inserting the nut housing members 40 in this way from the first opening portions 21a to the second opening portions 21c so that they will pass under the fixed portions 33a (so that they will pass second surface 33a2 sides) of the control terminals 33, the control terminals 33 are fixed reliably to the case 20.

Furthermore, the control terminals 33 and external wirings (not illustrated) connected thereto may be fixed to each other by nuts embedded in the nut housing members 40 and bolts put through the holes 33b. The control terminals 33 are fixed by the nut housing members 40 inserted into the terminal housing areas 21 under the control terminals 33, and the surfaces of the control terminals 33 are leveled accurately with one another. This makes it easy to connect the external wirings and the control terminals 33.

As illustrated in FIG. 5A, the opening portion 21e of the case 20 has a taper shape. That is to say, the inside of the opening portion 21e is wide and the opening portion 21e is narrow on the upper surface side of the case 20. A contact portion (referred to as a shoulder portion) of the control terminal 33 which comes in contact with the taper portion of the opening portion 21e is formed to have a taper shape so that it will fit into the taper portion.

The taper portion of the opening portion 21e and the contact portion of the control terminal 33 come in contact with each other at their taper areas. By making the taper portion of the opening portion 21e and the contact portion of the control terminal 33 taper, their taper areas come in contact with each other in the process of inserting the nut housing member 40, for example, even if the control terminal 33 tilts and comes in contact with part of the taper area. The shoulder portion of the control terminal 33 fits into the taper portion of the opening portion 21e and their taper areas come in contact with each other. As a result, the front surface (first surface 33a1) of the control terminal 33 becomes parallel to the surface of the case 20. Accordingly, the surfaces of the control terminals 33 are leveled with one another with great accuracy. In addition, the insertion of the nut housing member 40 prevents the positional deviation of the control terminal 33 from the opening portion 21e or wobbling of the control terminal 33.

Preferably, the taper portion of the opening portion 21e expands in a direction from the outside to the inside and has a taper shape so that the contact portion of the control terminal 33 will fit into the taper portion of the opening portion 21e. The taper portion of the opening portion 21e may have a taper shape across the entire width. Alternatively, a concavity in which the contact portion of the control terminal 33 is housed may be formed in part of the taper portion of the opening portion 21e. Furthermore, a thinnish taper or a conical (cone-shaped) taper may be used.

The nut housing member will now be described by the use of FIGS. 6A through 6C.

Figure 6A:
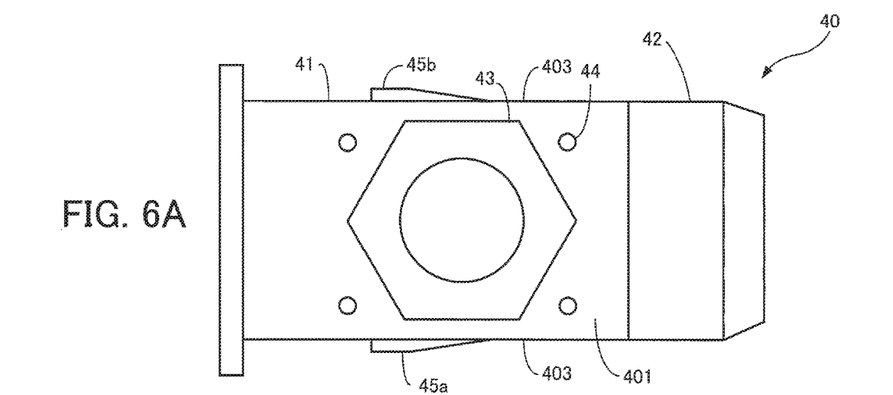
FIGS. 6A through 6C illustrate a nut housing member included in the semiconductor device according to the first embodiment.
Figure 6B:
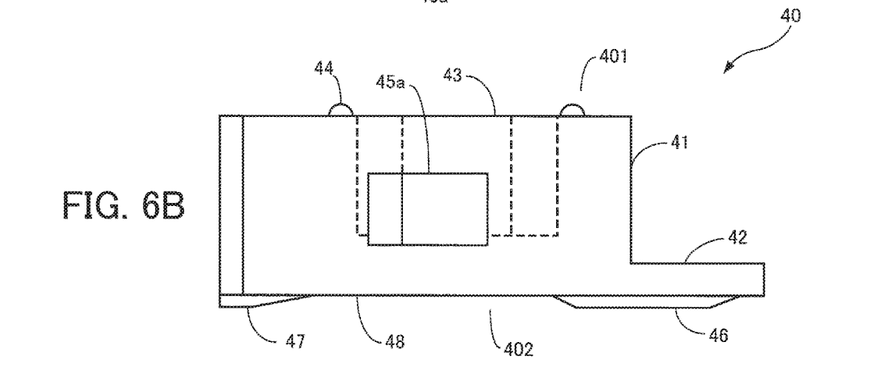
Figure 6C:
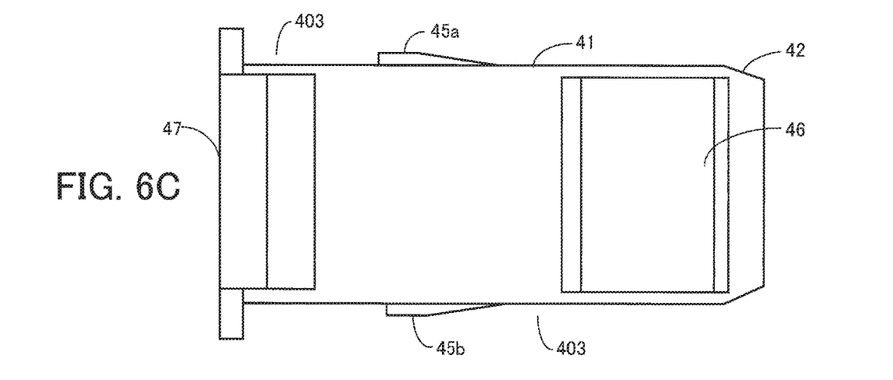

FIGS. 6A through 6C illustrate the nut housing member included in the semiconductor device according to the first embodiment.

FIG. 6A is a top view of the nut housing member 40. FIG. 6B is a side view of the nut housing member 40. FIG. 6C is a bottom view of the nut housing member 40. Furthermore, FIG. 6B illustrates a nut housing portion 43 by a dashed line.

The nut housing member 40 has at least an upper surface (third surface 401) and an under surface (fourth surface 402) opposite the upper surface and includes a body portion 41 having a rectangular parallelepiped shape, a protrusion 42, a nut housing portion 43, a fifth protrusion 44, a third protrusion 45a and a fourth protrusion 45b, a first protrusion 46, and a second protrusion 47.

The protrusion 42 is disposed on a front side of the nut housing member 40. The protrusion 42 is formed so as to protrude from a front-side end portion on an under surface side of the body portion 41. The nut housing member 40 is inserted into the case 20 from the protrusion 42 side on the front side. The protrusion 42 may be worked so as to have a taper shape in the front.

The nut housing portion 43 is an opening portion formed on an upper surface side of the nut housing member (body portion 41). A nut is housed in the nut housing portion 43. The depth of the nut housing portion 43 is, for example, about half of the height of the nut housing member 40 (body portion 41).

The fifth protrusion 44 is formed around the nut housing portion 43 on the upper surface side of the nut housing member 40 (body portion 41). The fifth protrusion is provided in plurality (four, for example). In addition, each fifth protrusion 44 has a hemispherical shape and is, for example, about 0.1 mm in height and about 0.1 mm in diameter. The reason for this is as follows. When the nut housing member 40 is inserted into the terminal housing area 21 under the control terminal 33, the fifth protrusions 44 smoothly slide on the control terminal 33. As a result, the nut housing member 40 is smoothly housed in the terminal housing area 21. In the example of FIGS. 6A through 6C, four fifth protrusions 44 are formed. However the number of the fifth protrusions 44 is not limited to four. It is desirable to form at least three fifth protrusions 44.

The third protrusion 45a and the fourth protrusion 45b may be attached to portions near the centers of side surfaces 403 of the nut housing member 40 (body portion 41). The two side surfaces 403 opposite each other connect with the upper surface (third surface 401) and the under surface (fourth surface 402). Furthermore, each of the third protrusion 45a and the fourth protrusion 45b is worked so as to have a taper shape in the front (on a protrusion 42 side). The third protrusion 45a and the fourth protrusion 45b may be disposed nearer the upper surface of the nut housing member 40. The third protrusion 45a and the fourth protrusion 45b are disposed so as to come in contact with portions near the shoulder portion of the control terminal 33. By doing so, the control terminal 33 may be fixed to the case 20 more reliably.

The first protrusion 46 is disposed on the front of the under surface of the nut housing member 40. In FIGS. 6A through 6C, the first protrusion 46 is disposed from the front of the protrusion 42 to the body portion 41. The first protrusion 46 may be worked so as to have a taper shape in the front and the back.

The second protrusion 47 is disposed on the back of the under surface of the nut housing member 40 with distance kept from the first protrusion 46. The second protrusion 47 may be worked so as to have a taper shape in the front.

In addition, the nut housing member 40 has a concavity 48 between the first protrusion 46 and the second protrusion 47 on an under surface side which is defined by the first protrusion 46 and the second protrusion 47.

The nut housing member 40 is disposed in the terminal housing area 21 between the first opening portion 21a and the second opening portion 21c so as to pass the second surface 33a2 side of the fixed portion 33a. The first protrusion 46 is in contact with a lower end of the second opening portion 21c and the second protrusion 47 is in contact with a lower end of the first opening portion 21a.

The first protrusion 46 and the second protrusion 47 are equal in height and are, for example, about 150 to 200 µm in height.

The above nut housing member 40 is formed, for example, by injection molding by the use of resin. At this time the body portion 41, the protrusion 42, the nut housing portion 43, the fifth protrusions 44, the third protrusion 45a and the fourth protrusion 45b, the first protrusion 46, and the second protrusion 47 are integrally molded. The nut housing member 40 and the case 20 are formed by the use of resin such as polyphenylene sulfide (PPS).

The insertion of the above nut housing member 40 into the case 20 will now be described by the use of FIGS. 7A through 7C and FIGS. 8A through 8C.

Figure 7A:
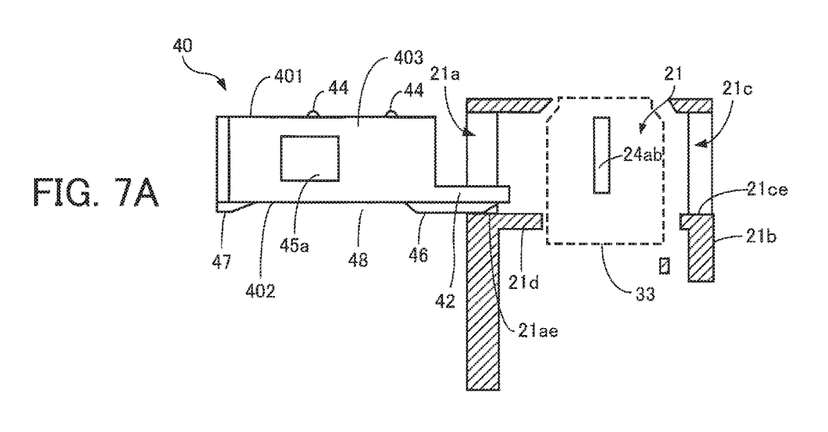
FIGS. 7A through 7C are sectional views for describing the insertion of the nut housing member into the case in the first embodiment.
Figure 7B:
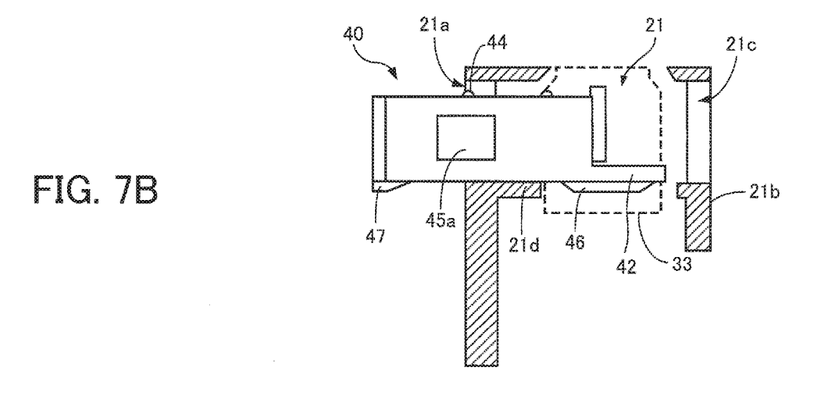
Figure 7C:
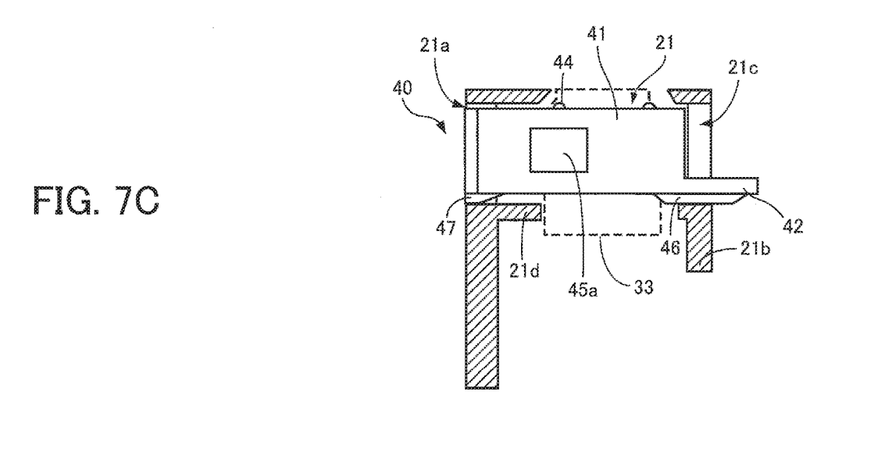
Figure 8A:
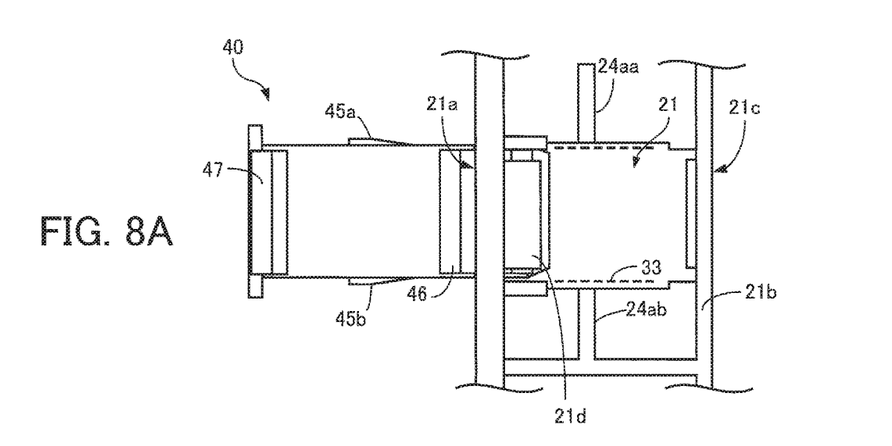
FIGS. 8A through 8C are bottom views for describing the insertion of the nut housing member into the case in the first embodiment.
Figure 8B:
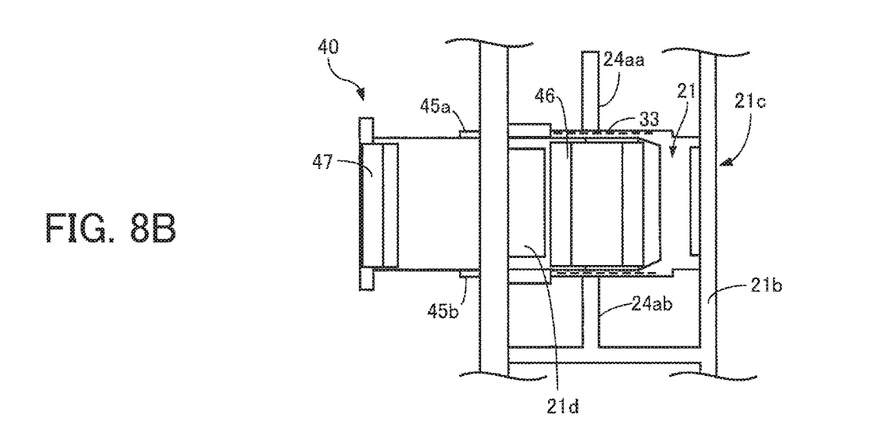
Figure 8C:
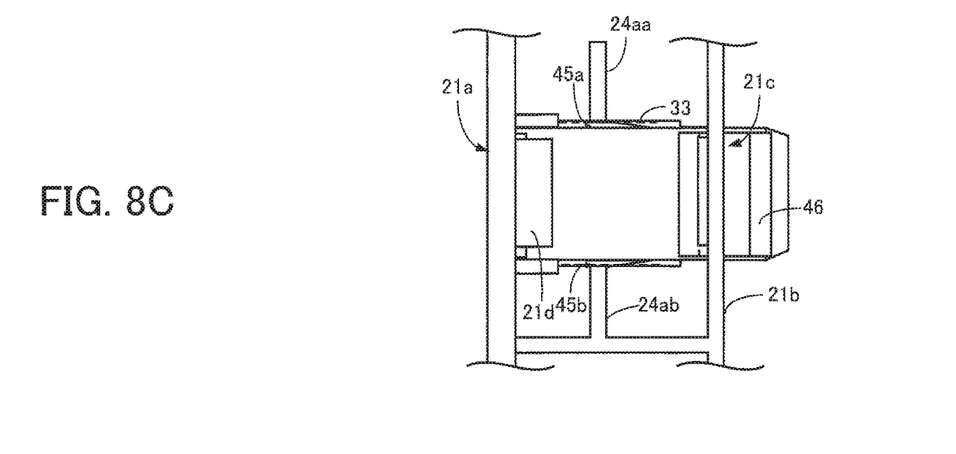

FIGS. 7A through 7C are sectional views for describing the process in the first embodiment of inserting the nut housing member into the case and assembling the semiconductor device. FIGS. 8A through 8C are bottom views for describing the insertion of the nut housing member into the case in the first embodiment.

FIGS. 7A through 7C are enlarged sectional views of the terminal housing area 21 into which the nut housing member 40 is inserted. FIGS. 8A through 8C are enlarged bottom views of the terminal housing area 21 into which the nut housing member 40 is inserted. Furthermore, the position of the control terminal 33 is indicated by a dashed line in FIGS. 7A through 7C and FIGS. 8A through 8C.

As illustrated in FIG. 7A and FIG. 8A, first the protrusion 42 of the nut housing member 40 is inserted into the first opening portion 21a of the case 20.

At this time the first protrusion 46 disposed on the front of the under surface of the nut housing member 40 comes in contact with and slides on a lower end 21ae of the first opening portion 21a and a guide portion 21d disposed in the first opening portion 21a. By doing so, the nut housing member 40 is inserted into the case 20.

Next, when the nut housing member 40 is inserted further into the case 20, the first protrusion 46 passes through the lower end 21ae of the first opening portion 21a and the guide portion 21d as illustrated in FIG. 7B. The concavity 48 comes in contact with the lower end 21ae of the first opening portion 21a and the guide portion 21d. As a result, the nut housing member 40 is inserted into the case 20 in a state in which an under surface of the body portion 41 of the nut housing member 40 is placed on the lower end 21ae of the first opening portion 21a and the guide portion 21d. At this time the upper surface of the nut housing member 40 including the fifth protrusions 44 does not come in contact with an upper end of the first opening portion 21a. The process of inserting the nut housing member 40 from the first opening portion 21a to the second opening portion 21c while making the first protrusion 46 come in contact with the lower end 21ae of the first opening portion 21a and then making the concavity 48 come in contact with the lower end 21ae of the first opening portion 21a is performed. By doing so, even if the nut housing member 40 is inserted into the first opening portion 21a in a state in which the front of the nut housing member 40 is inclined downward, the attitude of the nut housing member 40 is corrected.

In addition, as illustrated in FIG. 8B, the third protrusion 45a and the fourth protrusion 45b disposed on the side surfaces 403 of the nut housing member 40 come in contact with side portions of the first opening portion 21a and the nut housing member 40 is inserted into the center of the case 20.

Next, when the nut housing member 40 is inserted further into the case 20, the first protrusion 46 and the second protrusion 47 of the nut housing member 40 move in order onto a lower end of the second opening portion 21c (first beam 21b) and the lower end 21ae of the first opening portion 21a, respectively, as illustrated in FIG. 7C. As a result, the protrusion 42 is inserted into the second opening portion 21c. At this time, the first protrusion 46 of the nut housing member 40 comes in contact with the lower end of the second opening portion 21c (first beam 21b), the second protrusion 47 of the nut housing member 40 comes in contact with the lower end 21ae of the first opening portion 21a, and the nut housing member 40 fits into the case 20. Furthermore, the fifth protrusions of the nut housing member 40 support the control terminal 33 in an upward direction in FIG. 7C. As a result, the control terminal 33 is fixed to the case 20.

In addition, as illustrated in FIG. 8C, at this time the third protrusion 45a and the fourth protrusion 45b disposed on the side surfaces 403 of the nut housing member 40 are in contact with the second beam 24aa and the third beam 24ab, respectively, with the control terminal 33 therebetween. As a result, the nut housing member 40 is aligned with a central portion of the terminal housing area 21 of the case 20 and is fixed. Only one of a combination of the third protrusion 45a and the second beam 24aa and a combination of the fourth protrusion 45b and the third beam 24ab may be disposed.

As has been described, with the above semiconductor device 10 the case 20 is disposed so as to cover the upside of the laminated substrate 32 and the semiconductor chips 39. The case 20 has the first opening portions 21a formed in the side surfaces and the second opening portions 21c opposite the first opening portions 21a. The second opening portions 21c are disposed in the first beams 21b formed inside the case 20. The terminal housing areas 21 which house the control terminals 33 are formed between the first opening portions 21a and the second opening portions 21c. The fixed portions 33a of the control terminals 33 are exposed from the terminal housing areas 21 on the upper surface side of the case 20.

Furthermore, the semiconductor device 10 includes the nut housing members 40. Each nut housing member 40 has the nut embedded, the first protrusion 46 disposed on the front of the under surface, and the second protrusion 47 disposed on the back of the under surface. A bolt, together with the nut, which pierces the exposed control terminal 33 is used for fastening. When the nut housing member 40 is inserted from the first opening portion 21a, through the terminal housing area 21, into the second opening portion 21c, the first protrusion 46 comes in contact with the lower end of the second opening portion 21c and the second protrusion 47 comes in contact with the lower end 21ae of the first opening portion 21a.

When the nut housing member 40 is inserted from the first opening portion 21a into the case 20 (terminal housing area 21) in the semiconductor device 10, the first protrusion 46 and the second protrusion 47 of the nut housing member 40 slide on and pass through both or one of the first opening portion 21a and the second opening portion 21c. Ultimately, the first protrusion 46 of the nut housing member 40 comes in contact with the lower end of the second opening portion 21c, the second protrusion 47 of the nut housing member 40 comes in contact with the lower end 21ae of the first opening portion 21a, and the nut housing member 40 is housed in the case 20 (terminal housing area 21). For example, even if the nut housing member 40 is not inserted in parallel with the terminal housing area 21 at the beginning of assembly, the forefront does not hit against the first beams 21b and the nut housing member 40 is stably inserted in this way into the case 20. As a result, the nut housing member 40 is housed reliably in the terminal housing area 21 of the case 20 and the assemblability of the nut housing member 40 with respect to the case 20 is improved.

In addition, the third protrusion 45a is disposed on the side surface 403 of the body portion 41 of the nut housing member 40 and the fourth protrusion 45b is disposed on the opposite side surface 403 of the body portion 41 of the nut housing member 40. When the nut housing member 40 is inserted from the first opening portion 21a into the case 20 (terminal housing area 21), the third protrusion 45a comes in contact with one end portion of the control terminal 33 and presses the one end portion of the control terminal 33 against the second beam 24aa. The fourth protrusion 45b presses the other end portion of the control terminal 33 against the third beam 24ab opposite the second beam 24aa. In addition, the fifth protrusions 44 of the nut housing member 40 come in contact with the second surface 33a2 of the fixed portion 33a and support the control terminal 33 in an upward direction. As a result, the nut housing member 40 and the control terminal 33 are aligned with great accuracy with the center of the terminal housing area 21 and are fixed. If the nut housing member 40 and the control terminal 33 are aligned in this way, the assemblability of a bolt with respect to the nut of the nut housing member 40 is improved. It is desirable that the first protrusion 46 be shorter in a direction from the front (protrusion 42) side to the back (second protrusion 47) side of the fourth surface 402 than the terminal housing area 21 between the first opening portion 21a and the second opening portion 21c. As illustrated in FIG. 7B, if the first protrusion 46 is short, the concavity 48 may be supported by the lower end 21ae of the first opening portion 21a.

Second Embodiment

In a second embodiment a nut housing member other than the nut housing member 40 in the first embodiment will be described by the use of FIGS. 9A and 9B.

Figure 9A:
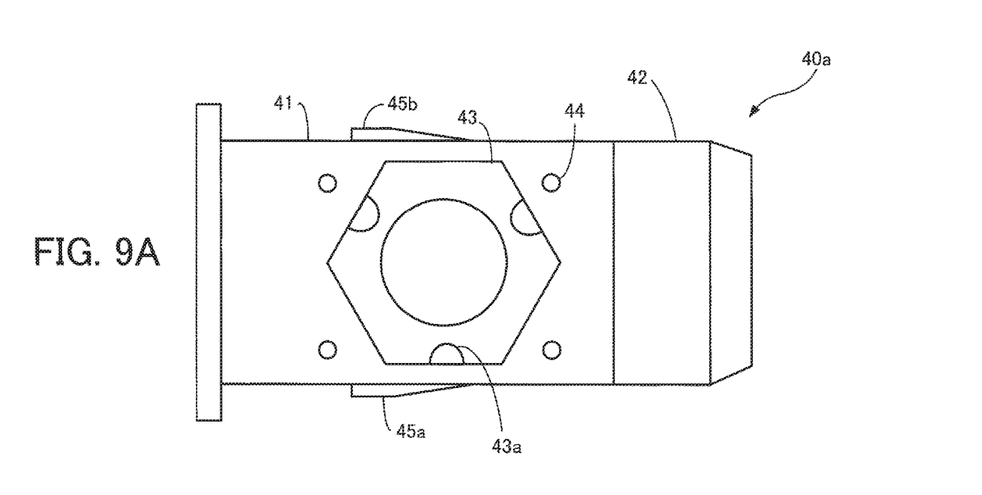
FIGS. 9A and 9B illustrate a nut housing member included in a semiconductor device according to a second embodiment.
Figure 9B:
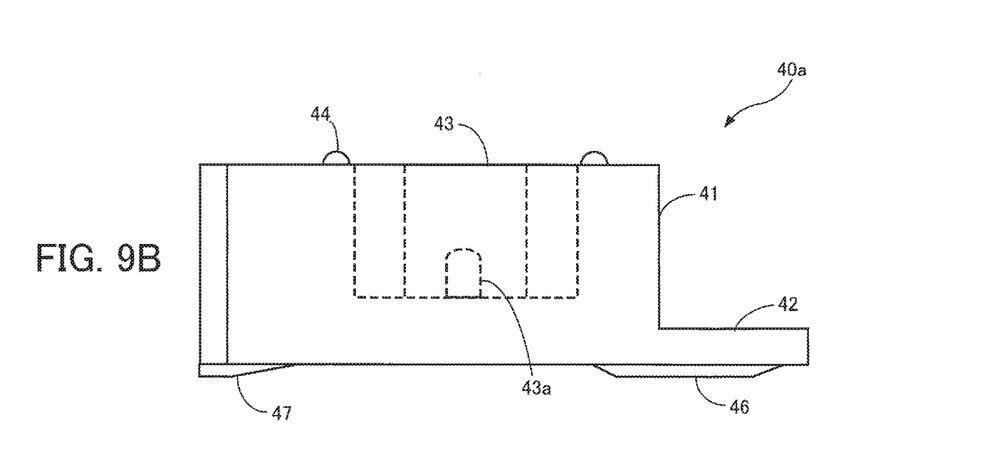

FIGS. 9A and 9B illustrate a nut housing member included in a semiconductor device according to a second embodiment.

FIG. 9A is a top view of a nut housing member 40a. FIG. 9B is a side view of the nut housing member 40a. A third protrusion 45a and a fourth protrusion 45b are not illustrated in FIG. 9B.

Components of the nut housing member 40a which are the same as those of the nut housing member 40 in the first embodiment are marked with the same numerals. As illustrated in FIG. 9A, unlike the nut housing member 40 in the first embodiment, nut fixing portions 43a are disposed at three spots corresponding to sides of a nut on an inner wall of a nut housing portion 43 of the nut housing member 40a.

When the nut is housed in the nut housing portion 43 of the nut housing member 40a, the nut is press-fitted to press the nut fixing portions 43a. The nut press-fitted and housed in the nut housing portion 43 is pressed by the nut fixing portions 43a, is aligned with great accuracy with the nut housing portion 43, and is fixed. When the nut housing member 40a in which the nut is housed in this way is inserted into a terminal housing area 21 of a case 20 in the same way as with the first embodiment, the nut is aligned with great accuracy with the nut housing portion 43 of the nut housing member 40a and the nut housing member 40a and a control terminal 33 are aligned with great accuracy with the center of the terminal housing area 21 and are fixed. Accordingly, if alignment of the nut with the nut housing member 40a and alignment of the control terminal 33 with the nut housing member 40a are performed in this way, the assemblability of a bolt with respect to the nut of the nut housing member 40a is improved further.

It is desirable to dispose at least three nut fixing portions 43a in the nut housing portion 43. Furthermore, it is desirable to set the height of the nut fixing portions 43a so as to reliably press and fix the press-fitted nut. As illustrated in FIG. 9B, for example, it is desirable that the height of the nut fixing portions 43a be greater than or equal to one third of and smaller than or equal to half of the height (depth) from the bottom of the nut housing portion 43.

According to the above semiconductor devices, assemblability is improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
 a laminated substrate having an insulating board, and a circuit board disposed over a principal plane of the insulating board;
 a semiconductor chip disposed over the circuit board, and having a control electrode;
 a control terminal having a fixed portion with a first surface and a second surface opposite to the first surface, the control terminal being disposed over the circuit board, and being electrically connected to the control electrode;
 a case disposed on a principal plane side of the insulating board, and covering the circuit board and the semiconductor chip, the case having
  an upper surface, a side surface that connects with the upper surface,
a first beam formed on the upper surface and being disposed inside of the case,
a first opening portion formed in the side surface,
a second opening portion formed in the first beam and opposite to the first opening portion, and
a terminal housing area between the first opening portion and the second opening portion for housing the control terminal, the first surface of the fixed portion being exposed from the terminal housing area on an upper surface side; and
a nut housing member which has a third surface, a fourth surface opposite to the third surface, a first protrusion disposed on a front side of the fourth surface, a second protrusion disposed on a back side of the fourth surface, and a concavity disposed between the first protrusion and the second protrusion, the nut housing member being adapted to house a nut,
wherein the nut housing member is inserted from the first opening portion, through a second surface side of the fixed portion, and into the second opening portion, the first protrusion being brought into contact with a lower end of the second opening portion, and the second protrusion being brought into contact with a lower end of the first opening portion, the third surface of the nut housing facing the second surface of the fixed portion, the fourth surface of the nut housing facing the laminated substrate.

2. The semiconductor device according to claim 1, wherein:
the nut housing member further has fifth protrusions on the third surface; and
the nut housing member is inserted from the first opening portion, through the terminal housing area on the second surface side of the fixed portion, and into the second opening portion, so that the fifth protrusions are in contact with the second surface of the fixed portion.

3. The semiconductor device according to claim 1, wherein the first protrusion is shorter in a direction from the front side to the back side of the fourth surface than the terminal housing area between the first opening portion and the second opening portion.

4. The semiconductor device according to claim 1, wherein the first protrusion has a taper shape on the front side and the back side of the fourth surface.

5. The semiconductor device according to claim 1, wherein the first protrusion is 150 to 200 μm in height.

6. The semiconductor device according to claim 1, wherein the second protrusion is 150 to 200 μm in height.

7. The semiconductor device according to claim 1, wherein the nut housing member further has:
a nut housing portion adapted to house the nut; and
nut fixing portions disposed in the nut housing portion and which are configured to press the nut to press-fit the nut in place.

8. A semiconductor device, comprising:
a laminated substrate having an insulating board, and a circuit board disposed over a principal plane of the insulating board;
a semiconductor chip disposed over the circuit board, and having a control electrode;
a control terminal having a fixed portion with a first surface and a second surface opposite to the first surface, the control terminal being disposed over the circuit board, and being electrically connected to the control electrode;
a case disposed on a principal plane side of the insulating board, and covering the circuit board and the semiconductor chip, the case having
an upper surface,
a side surface that connects with the upper surface,
a first beam formed on the upper surface and being disposed inside of the case,
a first opening portion formed in the side surface,
a second opening portion formed in the first beam and opposite to the first opening portion, and
a terminal housing area between the first opening portion and the second opening portion for housing the control terminal, the first surface of the fixed portion being exposed from the terminal housing area on an upper surface side; and
a nut housing member which has a third surface, a fourth surface opposite to the third surface, a first protrusion disposed on a front side of the fourth surface, a second protrusion disposed on a back side of the fourth surface, and a concavity disposed between the first protrusion and the second protrusion, the nut housing member being adapted to house a nut,
wherein: the nut housing member is inserted from the first opening portion, through a second surface side of the fixed portion, and into the second opening portion, the first protrusion being brought into contact with a lower end of the second opening portion, and the second protrusion being brought into contact with a lower end of the first opening portion;
the case further has a second beam between the first opening portion and the second opening portion, the second beam facing the terminal housing area;
the nut housing member further has a first side surface which connects with the third surface and the fourth surface, and a second side surface opposite to the first side surface and has a third protrusion disposed on the first side surface; and
the nut housing member is inserted through the terminal housing area on the second surface side of the fixed portion and the third protrusion presses the control terminal against the second beam.

9. The semiconductor device according to claim 8, wherein:
the case further has a third beam disposed between the first opening portion and the second opening portion, and opposite to the second beam with the terminal housing area therebetween;
the nut housing member further has a fourth protrusion disposed on the second side surface; and
the nut housing member is inserted through the terminal housing area on the second surface side of the fixed portion, and the fourth protrusion presses the control terminal against the third beam.

10. The semiconductor device according to claim 9, wherein the second beam and the third beam are disposed in parallel with the first beam.

11. The semiconductor device according to claim 8, wherein the third protrusion is disposed on the first side surface near the third surface.

12. A semiconductor device, comprising:
a laminated substrate having an insulating board, and a circuit board disposed over a principal plane of the insulating board;
a semiconductor chip disposed over the circuit board, and having a control electrode;
a control terminal having a fixed portion with a first surface and a second surface opposite to the first surface, the control terminal being disposed over the circuit board, and being electrically connected to the control electrode;

a case disposed on a principal plane side of the insulating board, and covering the circuit board and the semiconductor chip, the case having
an upper surface,
a side surface that connects with the upper surface,
a first beam formed on the upper surface and being disposed inside of the case,
a first opening portion formed in the side surface,
a second opening portion formed in the first beam and opposite to the first opening portion, and
a terminal housing area between the first opening portion and the second opening portion for housing the control terminal, the first surface of the fixed portion being exposed from the terminal housing area on an upper surface side; and a nut housing member which has a third surface, a fourth surface opposite to the third surface, a first protrusion disposed on a front side of the fourth surface, a second protrusion disposed on a back side of the fourth surface, and a concavity disposed between the first protrusion and the second protrusion, the nut housing member being adapted to house a nut, wherein the nut housing member is inserted from the first opening portion, through a second surface side of the fixed portion, and into the second opening portion, the first protrusion being brought into contact with a lower end of the second opening portion, and the second protrusion being brought into contact with a lower end of the first opening portion, and the second protrusion has a taper shape on the front side of the fourth surface.

13. A method for fabricating a semiconductor device, comprising:
providing a semiconductor device, including:
a laminated substrate having an insulating board, and a circuit board disposed over a principal plane of the insulating board;
a semiconductor chip disposed over the circuit board, and having a control electrode;
a control terminal having a fixed portion with a first surface and a second surface opposite to the first surface, the control terminal being disposed over the circuit board, and being electrically connected to the control electrode;

a case disposed on a principal plane side of the insulating board, and covering the circuit board and the semiconductor chip, the case having
an upper surface,
a side surface that connects with the upper surface,
a first beam formed on the upper surface and being disposed inside of the case,
a first opening portion formed in the side surface,
a second opening portion formed in the first beam and opposite to the first opening portion, and
a terminal housing area between the first opening portion and the second opening portion for housing the control terminal, the first surface of the fixed portion being exposed from the terminal housing area on an upper surface side; and a nut housing member which has a third surface, a fourth surface opposite to the third surface, a first protrusion disposed on a front side of the fourth surface, a second protrusion disposed on a back side of the fourth surface, and a concavity disposed between the first protrusion and the second protrusion, the nut housing member being adapted to house a nut;

inserting the nut housing member from the first opening portion, through a second surface side of the fixed portion, and into the second opening portion, the first protrusion being in contact with a lower end of the second opening portion, and the second protrusion being in contact with a lower end of the first opening portion; and while inserting the nut housing member from the first opening portion to the second opening portion, causing the concavity to come in contact with the lower end of the first opening portion after causing the first protrusion to come in contact with the lower end of the first opening portion, the third surface of the nut housing facing the second surface of the fixed portion, the fourth surface of the nut housing facing the laminated substrate.

14. The method for fabricating the semiconductor device, according to claim 13, further comprising causing, after causing the first protrusion to come in contact with the lower end of the second opening portion, the second protrusion to come in contact with the lower end of the first opening portion, to fit the nut housing member into the case.

* * * * *